(12) United States Patent
Saito et al.

(10) Patent No.: US 9,567,481 B2
(45) Date of Patent: Feb. 14, 2017

(54) RESIN COMPOSITION, RESIN VARNISH, PREPREG, METAL-CLAD LAMINATE AND PRINTED WIRING BOARD

(71) Applicant: PANASONIC INTELLECTUAL PROPERTY MANAGEMENT CO., LTD., Osaka (JP)

(72) Inventors: Hirosuke Saito, Osaka (JP); Hiroaki Fujiwara, Fukushima (JP); Yuki Kitai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/765,678

(22) PCT Filed: Jan. 16, 2014

(86) PCT No.: PCT/JP2014/000187
§ 371 (c)(1),
(2) Date: Aug. 4, 2015

(87) PCT Pub. No.: WO2014/125763
PCT Pub. Date: Aug. 21, 2014

(65) Prior Publication Data
US 2015/0376444 A1 Dec. 31, 2015

(30) Foreign Application Priority Data
Feb. 12, 2013 (JP) ................. 2013-024219

(51) Int. Cl.
| | |
|---|---|
| C09D 163/00 | (2006.01) |
| C08J 5/24 | (2006.01) |
| C08G 59/18 | (2006.01) |
| C08K 5/098 | (2006.01) |
| C08L 63/00 | (2006.01) |
| C08L 71/12 | (2006.01) |
| H05K 1/03 | (2006.01) |
| C08K 5/315 | (2006.01) |
| H05K 3/02 | (2006.01) |
| C08K 3/36 | (2006.01) |
| C08K 5/03 | (2006.01) |

(52) U.S. Cl.
CPC ............ *C09D 163/00* (2013.01); *C08G 59/18* (2013.01); *C08J 5/24* (2013.01); *C08K 5/098* (2013.01); *C08K 5/315* (2013.01); *C08L 63/00* (2013.01); *C08L 71/12* (2013.01); *H05K 1/0326* (2013.01); *H05K 1/0353* (2013.01); *C08J 2363/00* (2013.01); *C08J 2463/00* (2013.01); *C08K 3/36* (2013.01); *C08K 5/03* (2013.01); *H05K 1/0366* (2013.01); *H05K 1/0373* (2013.01); *H05K 3/022* (2013.01); *H05K 2201/0355* (2013.01); *H05K 2203/121* (2013.01)

(58) Field of Classification Search
CPC .................................................... C09D 163/00
See application file for complete search history.

(56) References Cited

U.S. PATENT DOCUMENTS

| 7,541,421 B2 | 6/2009 | Carrillo et al. |
|---|---|---|
| 2003/0236361 A1* | 12/2003 | Yeager .................. C09D 5/033 525/523 |
| 2007/0135609 A1 | 6/2007 | Carrillo et al. |
| 2009/0247724 A1 | 10/2009 | Carrillo et al. |
| 2010/0218982 A1 | 9/2010 | Fujiwara et al. |
| 2012/0006588 A1 | 1/2012 | Kakiuchi et al. |

FOREIGN PATENT DOCUMENTS

| CN | 102361903 | 2/2012 |
|---|---|---|
| JP | 2010-275341 A | 12/2010 |
| JP | 2011-074124 A | 4/2011 |
| JP | 2011-148919 A | 8/2011 |
| WO | 2007/067669 A | 6/2007 |
| WO | 2009/041137 A | 4/2009 |

OTHER PUBLICATIONS

International Search Report issued with respect to application No. PCT/JP2014/000187, mail date is Mar. 4, 2014.
International Preliminary Report on Patentability issued with respect to application No. PCT/JP2014/000187, mail date is Aug. 18, 2015.

* cited by examiner

*Primary Examiner* — Megan McCulley
(74) *Attorney, Agent, or Firm* — Greenblum & Bernstein, P.L.C.

(57) ABSTRACT

The invention relates to a resin composition which is characterized by including: a reaction product that includes (A) a polyphenylene ether having an average of 1.5 to 2 hydroxyl groups per molecule and (B) an epoxy compound having an average of 2 to 2.3 epoxy groups per molecule, wherein the reaction product is obtained by pre-reacting at least a part of hydroxyl groups on the polyphenylene ether (A) with epoxy groups on the epoxy compound (B) so that the concentration of terminal hydroxyl groups on the polyphenylene ether (A) becomes 700 μmol/g or less; (C) a cyanate ester compound; and (D) an organometallic salt.

16 Claims, No Drawings

RESIN COMPOSITION, RESIN VARNISH, PREPREG, METAL-CLAD LAMINATE AND PRINTED WIRING BOARD

TECHNICAL FIELD

The invention relates to a resin composition that is well-suited for use as an insulating material or the like in printed wiring boards, to a method of producing the resin composition, to a resin varnish containing the resin composition, to a prepreg obtained using the resin varnish, to a metal-clad laminate obtained using the prepreg, and to a printed wiring board manufactured using the prepreg.

BACKGROUND ART

In recent years, the growth in the information throughput of various types of electronic equipment has been accompanied by rapid advances in packaging technology, including higher integration of the semiconductor devices within the equipment, higher wiring density, and multi layer construction. To increase the signal transmission rate and reduce loss during signal transmission, there exists a desire for insulating materials in printed wiring boards and the like that are used in various electronic equipment to have a low dielectric constant and a low dielectric loss tangent.

Because polyphenylene ethers (PPE) have excellent dielectric properties such as dielectric constant and loss tangent even in the MHz to GHz high-frequency bands (high-frequency regions), they are effectively used in insulating materials for printed wiring boards and the like in electronic equipment which utilizes high-frequency bands. However, because high-molecular-weight PPEs generally have a high melting point, they tend to have a high viscosity and a low flowability. In addition, when such PPEs are used to form prepregs for use in the manufacture of multilayer printed wiring boards and the like and when printed wiring boards are manufactured using the prepregs thus formed, moldability problems have arisen; namely, molding defects such as voids arise during multilayer molding, making it difficult to obtain printed wiring boards having a high reliability. One known technique for resolving such problems involves lowering the molecular weight of the PPE by subjecting high-molecular-weight PPE to a redistribution reaction within a solvent and in the presence of a phenol compound and a radical initiator so as to give rise to molecular cleavage. However, when PPE is rendered to a low molecular weight, curing is inadequate and the heat resistance and other properties of the cured product tend to decline.

Hence, in order to increase the heat resistance and other properties of the cured product, as described in Patent Literature 1 below, the use of a thermoset resin such as an epoxy resin in combination with PPE has been reported. Specifically, Patent Literature 1 describes a resin composition which is characterized by including the reaction product of a polyphenylene ether having a number-average molecular weight of from 800 to 2,000 and an average of 1.5 to 2 hydroxyl groups per molecule with an epoxy resin having a small number of epoxy groups, namely, an average of 2.3 or fewer epoxy groups per molecule, and also a thermoset resin.

The art in Patent Literature 1 indicates that the heat resistance and the adhesion can be enhanced while retaining the excellent dielectric properties of PPE. However, in recent years the standards required of printed wiring boards and the like have risen further, and so materials endowed with even better properties are now desired in order to meet the demand for higher performance. For example, to enhance the reliability and heat resistance in high multilayer printed wiring boards, further improvements are desired not only in the high glass transition temperature (Tg) and heat resistance of cured resin materials, but also in the bond strength (the adhesive strength between layers or with copper foil in a copper-clad laminate or the like).

The invention has been made in view of the above circumstances, and its object is to provide a resin composition which has an even higher level of bond strength while retaining the excellent dielectric properties of PPE and also the heat resistance and other properties of cured products thereof. Further objects of the invention are to provide a prepreg that uses such a resin composition, a metal-clad laminate that uses such a prepreg, and a printed wiring board that uses such a metal-clad laminate.

CITATION LIST

Patent Literature

Patent Literature 1: Japanese Unexamined Patent Publication No. 2010-275341

SUMMARY OF INVENTION

The inventors have conducted extensive investigations, as a result of which they have discovered that these objects can be achieved with a resin composition constituted as described below. Based on such findings, the inventors have conducted further investigations, in the course of which they have ultimately arrived at the present invention.

The resin composition according to one aspect of the invention is characterized by including: a reaction product that includes (A) a polyphenylene ether having an average of 1.5 to 2 hydroxyl groups per molecule and (B) an epoxy compound having an average of 2 to 2.3 epoxy groups per molecule, wherein the reaction product is obtained by pre-reacting at least a part of hydroxyl groups on the polyphenylene ether (A) with epoxy groups on the epoxy compound (B) so that the concentration of terminal hydroxyl groups on the polyphenylene ether (A) becomes 700 µmol/g or less; (C) a cyanate ester compound; and (D) an organometallic salt.

This invention makes it possible to provide a resin composition which has a higher level of adhesion while retaining the outstanding dielectric properties of PPE and also the heat resistance and other properties of cured products thereof. The invention additionally provides a resin varnish containing the resin composition, a prepreg obtained using the resin varnish, a metal-clad laminate obtained using the prepreg, and a printed wiring board manufactured using the prepreg.

DESCRIPTION OF EMBODIMENTS

The resin composition according to one embodiment of the invention is characterized by comprising: a reaction product that includes (A) a polyphenylene ether having an average of 1.5 to 2 hydroxyl groups per molecule and (B) an epoxy compound having an average of 2 to 2.3 epoxy groups per molecule, wherein the reaction product is obtained by pre-reacting at least a part of hydroxyl groups on the polyphenylene ether (A) with epoxy groups on the epoxy compound (B) so that the concentration of terminal hydroxyl groups on the polyphenylene ether (A) becomes 700 µmol/g or less; (C) a cyanate ester compound; and (D) an organometallic salt. That is, the resin composition is obtained by pre-reacting, under given conditions, at least a part of hydroxyl groups on the polyphenylene ether (A) with epoxy groups on the epoxy resin (B), then adding the cyanate ester compound (C) and the organometallic salt (D).

First, any polyphenylene ether having an average of 1.5 to 2 hydroxyl groups per molecule may be used without particular limitation as the polyphenylene ether (A). As used herein, "having an average of 1.5 to 2 hydroxyl groups per molecule" means that the average number of hydroxyl groups per molecule (referred to below simply as the "average number of hydroxyl groups") is from 1.5 to 2. At an average number of hydroxyl groups of 1.5 or more, three-dimensional crosslinking arises due to reaction with epoxy groups on the epoxy compound, enabling the adhesion when cured to be enhanced. Also, by having the average number of hydroxyl groups be 2 or less, the risk of gelation during pre-reaction is thought to disappear.

The average number of hydroxyl groups on the polyphenylene ether here will be apparent from the product specifications for the polyphenylene ether that is used. The average number of hydroxyl groups on the polyphenylene ether may be specifically, for example, the average number of hydroxyl groups per molecule of all the polyphenylene ether present in one mole of the polyphenylene ether.

The polyphenylene ether (A) preferably has a terminal hydroxyl group concentration of from 900 to 2,500 µmol/g. By carrying out the pre-reaction with epoxy using a polyphenylene ether having a terminal hydroxyl group concentration in this range and thus adjusting the terminal hydroxyl group concentration of the polyphenylene ether (A) to 700 µmol/g or less, a resin composition having a high bond strength is obtained without a loss of dielectric properties and other properties such as heat resistance, Tg and moldability.

Moreover, the use of such a polyphenylene ether (A) having a number-average molecular weight (Mn) of from 800 to 2,000 is preferred. This is exemplified by polyphenylene ether having a number-average molecular weight of 800 to 2,000 which is obtained directly by a polymerization reaction. At a number-average molecular weight of 800 or more, the dielectric properties, heat resistance and high Tg can be ensured. At a number-average molecular weight of 2,000 or less, even in cases where the reaction product obtained by reaction with an epoxy resin having a small number of epoxy groups has been included, resin flow and phase separation can be kept from occurring and the moldability can be kept from worsening.

The polyphenylene ether that is used, provided it is within a range that satisfies the claims, may be one obtained by subjecting polyphenylene ether having a number-average molecular weight of 2,000 or more to a redistribution reaction within a solvent and in the presence of a phenol compound and a radical initiator.

The number-average molecular weight (Mn) of the polyphenylene ether may be measured using a technique such as gel permeation chromatography.

Illustrative examples of the polyphenylene ether (A) include polyphenylene ethers composed of 2,6-dimethylphenol and at least one of a bifunctional phenol and a trifunctional phenol, and those composed primarily of a polyphenylene ether such as poly(2,6-dimethyl-1,4-phenylene oxide). Of these, a polyphenylene ether composed of 2,6-dimethylphenol and at least one of a bifunctional phenol and a trifunctional phenol is preferred. The bifunctional phenol is exemplified by tetramethyl bisphenol A. The polyphenylene ether is more specifically exemplified by compounds of general formula (1) below.

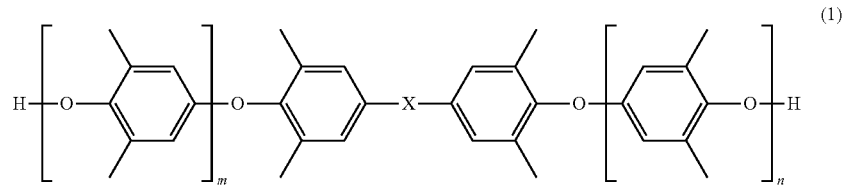

(1)

In formula (1), "m" and "n" should be such as to give a degree of polymerization where the number-average molecular weight (Mn) and the ratio Mw/Mn of the weight-average molecular weight (Mw) to the number-average molecular weight (Mn) both fall within the above-indicated ranges. Specifically, the sum of "m" and "n" is preferably from 1 to 30, with "m" being preferably from 0 to 20 and "n" being preferably from 0 to 20. Also, in formula (1), X represents an alkylene group of 1 to 3 carbons or a direct bond.

The epoxy compound (B) is not particularly limited, provided it is an epoxy compound having an average of 2 to 2.3 epoxy groups per molecule. At an average number of epoxy groups in this range, a reaction product with the polyphenylene ether (A) can be successfully formed while retaining the heat resistance of the cured product. If the average number of epoxy groups on the epoxy compound (B) is lower than 2, a sufficiently crosslinked structure cannot be achieved in the cured product, resulting in a lower heat resistance. On the other hand, if the average number of epoxy groups is higher than 2.3, the reactivity during pre-reaction may be too high, resulting in gelation.

Illustrative examples of the epoxy compound (B) include dicyclopentadiene epoxy resins, bisphenol A epoxy resins, bisphenol F epoxy resins, phenol-novolak epoxy resins, naphthalene epoxy resins and biphenyl epoxy resins. These may be used singly, or two or more may be used in combination. Of these, from the standpoint of enhancing the dielectric properties, the use of dicyclopentadiene epoxy resins is especially preferred. Alternatively, bisphenol A epoxy resins and bisphenol F epoxy resins can be suitably used because of their good compatibility with the polyphenylene ether (A). In addition, although not including a halogenated epoxy resin in the resin composition according to this embodiment is preferable from the standpoint of heat resistance, such a resin may be optionally included provided that doing so does not detract from the advantageous effects of the invention.

The average number of epoxy groups on the epoxy compound (B) here will be apparent from the product specifications for the epoxy resin that is used. The number of epoxy groups on the epoxy resin may be specifically, for example, the average number of epoxy groups per molecule of all the epoxy resin present in one mole of the epoxy resin.

The epoxy compound (B) has a solubility in toluene of preferably 10 mass % or more at 25° C. With such an epoxy compound, the heat resistance of the cured product can be satisfactorily increased without compromising the excellent dielectric properties of the polyphenylene ether. The reason appears to be that the compatibility with polyphenylene ether (A) is relatively high, thus facilitating uniform reaction with the polyphenylene ether.

The resin composition according to this embodiment, as mentioned above, includes the reaction product obtained by pre-reacting at least a part of hydroxyl groups on the polyphenylene ether (A) with epoxy groups on the epoxy compound (B) so that the concentration of terminal hydroxyl groups on the polyphenylene ether (A) becomes 700 μmol/g or less. The reaction product is not particularly limited, provided it is a product obtained by pre-reaction such that the concentration of terminal hydroxyl groups on the polyphenylene ether (A) becomes 700 μmol/g or less.

By using a reaction product obtained by pre-reaction such that the concentration of terminal hydroxyl groups on the polyphenylene ether (A) becomes 700 μmol/g or less, a very high level of adhesion can be achieved while retaining excellent dielectric properties and heat resistance. When the polyphenylene ether (A) and the epoxy compound (B) are used without pre-reaction, compared with the inclusion of reaction product obtained by pre-reaction, a high bond strength may not be obtained in the cured product.

So long as the concentration of terminal hydroxyl groups on the polyphenylene ether (A) following pre-reaction is 700 μmol/g or less, there appears to be no need to set a particular lower limit. However, taking into account the manufacturing time, the reaction efficiency and the influence of side-reactions, it is desirable that the terminal hydroxyl group concentration be 5 μmol/g or more.

The terminal hydroxyl group concentration can be regulated by adjusting the reaction temperature, reaction time and amount of catalyst, and by also adjusting the solids concentration at the time of the reaction.

More specifically, the reaction product may be obtained by, for example, effecting a reaction in the following way. First, the polyphenylene ether (A) and the epoxy compound (B) are stirred and mixed together in an organic solvent at a solids concentration of about 50 to 70% for about 10 to 60 minutes such as to achieve a predetermined ratio between the polyphenylene ether (A) and the epoxy compound (B). Next, following mixture of the polyphenylene ether (A) and the epoxy compound (B), the mixture is heated at 80 to 110° C. for 2 to 12 hours to induce reaction of the polyphenylene ether (A) with the epoxy compound (B), thereby giving the reaction product. The organic solvent is not particularly limited, provided it dissolves the polyphenylene ether (A), the epoxy compound (B) and the like, and does not interfere with their reaction. By way of illustration, the organic solvent may be, for example, toluene.

Concerning the ratio between the polyphenylene ether (A) and the epoxy compound (B) that are to be pre-reacted, there is no particular limitation on the molar ratio of epoxy groups on the epoxy compound (B) to hydroxyl groups on the polyphenylene ether (A), provided this is a molar ratio at which the above reaction product can be obtained. Specifically, the molar ratio of epoxy groups on the epoxy compound (B) to hydroxyl groups on the polyphenylene ether (A), expressed as epoxy groups/hydroxyl groups, is preferably from 3 to 6, and more preferably from about 3.5 to about 5.5. One advantage of having the molar ratio fall within such a range is that both ends of the PPE can be efficiently capped. In addition, the viscosity of the reaction product decreases, as a result of which the viscosities of the subsequently described resin varnish and prepreg can be lowered, which is thought to enhance manufacturability. Also, when the molar ratio is more than 6, the reaction efficiency decreases, which may lead to a worsening in the dielectric properties owing to a decline in the amount of PPE in the composition. On the other hand, when the molar ratio is less than 3, there is a higher possibility of two molecules of PPE reacting with one molecule of epoxy resin and a higher possibility of the epoxy and the PPE reacting so as to connect linearly, the viscosity of the reaction product may rise excessively, and the capping efficiency at both ends of the PPE may decline.

When reacting the polyphenylene ether (A) with the epoxy compound (B), a catalyst may be mixed into the mixture of the polyphenylene ether (A) and the epoxy compound (B). The catalyst used is not particularly limited, and may be any catalyst that is able to promote the reaction between hydroxyl groups on the polyphenylene ether (A) and epoxy groups on the epoxy compound (B). Illustrative examples include organometallic salts such as the zinc, copper and iron salts of organic acids such as octoic acid, stearic acid, naphthenic acid, salicylic acid and acetylacetonate; tertiary amines such as 1,8-diazabicyclo[5.4.0]undecene-7 (DBU), triethylamine and triethanolamine; imidazoles such as 2-ethyl-4-methyl-imidazole (2E4MZ) and 4-methylimidazole; and organic phosphines such as triphenylphosphine (TPP), tributylphosphine and tetraphenylphosphonium tetraphenylborate. These may be used singly or two or more may be used in combination. Of these, imidazoles, particularly 2-ethyl-4-methyl-imidazole, are especially preferred for use because they can shorten the reaction time and moreover are able to suppress polymerization between epoxy resins (epoxy resin self-polymerization). The content of the catalyst is preferable from 0.05 to 1 part by mass per 100 parts by mass of the polyphenylene ether (A) and the epoxy compound (B) combined. If the catalyst content is too small, the reactions between hydroxyl groups on the polyphenylene ether (A) and epoxy groups on the epoxy compound (B) tend to take a very long time. On the other hand, if the catalyst content is too high, control of the reaction is difficult and gelation tends to arise.

Taking into consideration the reaction efficiency and the viscosity (manufacturability), the solids concentration during the reaction is preferably about 50 to 70%.

Next, it is preferable to use a compound having an average number of cyanate groups per molecule of 2 or more as the cyanate ester compound (C). Having such a high number of cyanate groups is preferable in that the cured product obtained from the resulting resin composition has a higher heat resistance. The average number of cyanate groups on the cyanate ester compound (C) here will be apparent from the product specifications for the cyanate resin that is used. The number of cyanate groups on the cyanate ester compound (C) may be specifically, for example, the average number of cyanate groups per molecule of all the cyanate resin present in one mole of the cyanate resin.

Illustrative examples of the cyanate ester compound (C) include aromatic cyanate ester compounds such as 2,2-bis (4-cyanatophenyl)propane (a bisphenol A cyanate resin), bis(3,5-dimethyl-4-cyanatophenyl)methane, 2,2-bis(4-cyanatophenyl)ethane, and derivatives thereof. These may be used singly or two or more may be used in combination.

The organometallic salt (D) acts as an accelerator for accelerating the curing reaction (crosslinking reaction) between the reaction product and the cyanate ester compound (C). By using an organometallic salt as the accelerator, the cured product can be ensured of having a high Tg and a good heat resistance and adhesion.

As the organometallic salt (D), use may be made of, for example, what are generally referred to as metal soaps. Specific examples include organometallic salts composed of an organic acid such as octoic acid, naphthenic acid, stearic acid, lauric acid and ricinolic acid or acetyl acetate and a metal such as zinc, copper, cobalt, lithium, magnesium, calcium or barium. Of these, preferred use can be made of copper naphthenate because it has a low cyanate ester trimerization reaction activity, giving the varnish or prepreg a relatively good pot life (while moreover retaining heat resistance). The organometallic salt (D) may be used singly or two or more may be used as in combination.

The amount of the organometallic salt (D) included is preferably from 0.001 to 1 part by mass per 100 parts by mass of the combined amount of the reaction product and the cyanate ester compound (C). Within this range, the cure accelerating effect is increased and the high heat resistance and Tg of the cured product can be ensured, in addition to which prepregs that are free of moldability problems are easily produced.

In addition to the above essential ingredients, the resin composition of this embodiment may include also another epoxy compound (E). This epoxy compound (E), as with the above epoxy compound (B), may be an epoxy compound having an average of 2 to 2.3 epoxy groups per molecule. Examples include dicyclopentadiene epoxy resins, bisphenol A epoxy resins, bisphenol F epoxy resins, phenol-novolak epoxy resins, naphthalene epoxy resins and biphenyl epoxy resins. These may be used singly or two or more may be used in combination. In this case, epoxy compound (E) may be the same as epoxy compound (B) or may be different. From the standpoint of enhancing the dielectric properties, the use of a dicyclopentadiene epoxy resin is preferred. In addition to epoxy compounds having an average of 2 to 2.3 epoxy groups per molecule, use can also be made of high-functionality (having more than an average of 2.3 epoxy groups per molecule) epoxy compounds such as cresol-novolak epoxy resins as the epoxy compound (E).

In cases where a dicyclopentadiene epoxy resin is included as epoxy compound (B) and/or epoxy compound (E), it is preferable for the dicyclopentadiene epoxy compound to be included in an amount of 50 mass % or more, based on the total epoxy compound in which (B) and (E) are combined. Owing to the dielectric properties, a better insulating material can thus be obtained.

When the combined amount of the polyphenylene ether (A), epoxy compound (B), the cyanate ester compound (C) and epoxy compound (E) is 100 parts by mass (including cases where the content of epoxy compound (E) is 0 parts by mass), the major ingredients other than the organometallic salt (D) in the resin composition according to this embodiment are preferably included in the following amounts: from 20 to 40 parts by mass of the polyphenylene ether (A), from 20 to 60 parts by mass of epoxy compound (B) and epoxy compound (E) combined (in cases where the content of epoxy compound (E) is 0 parts by mass, the content of epoxy compound (B) is from 20 to 60 parts by mass), and from 20 to 40 parts by mass of the cyanate ester compound (C). By employing such a compounding ratio, excellent dielectric properties, heat resistance and adhesion (bondability) all appear to be achievable.

An inorganic filler (F) may also be included, as needed, in the resin composition for such purposes as to increase dimensional stability during heating and to increase flame retardancy. Illustrative examples of the inorganic filler (F) include silica, aluminum hydroxide, alumina, talc, magnesium hydroxide, titanium oxide, mica, aluminum borate, barium sulfate and calcium carbonate. These inorganic fillers may be used directly as is, although ones that have been surface-treated with an epoxysilane or aminosilane-type silane coupling agent are especially preferred. Metal-clad laminates obtained using a polyphenylene ether resin composition that includes an inorganic filler surface-treated with such a silane coupling agent have a high heat resistance during humidification, in addition to which the peel strength between layers tends to be higher.

In cases where silica is used as the inorganic filler, taking into account the flow properties during molding and the processability in printed wiring boards, the use of spherical type silica is preferred.

When an inorganic filler is included in the resin composition, the content thereof depends also on such factors as the type of inorganic filler used. For example, when silica is used, letting the combined amount of components (A) to (E) be 100 parts by mass, the silica is included in an amount of about 20 to 100 parts by mass.

In addition, a halogenated flame retardant (G) or a non-halogenated flame retardant may be included in the resin composition to increase the flame retardancy. The use of a halogenated flame retardant, along with imparting flame retardancy, has the additional advantages of discouraging a decrease in the Tg of the cured product and resisting a large decline in the heat resistance.

By using a halogenated flame retardant, even in cases where a dicyclopentadiene epoxy resin that is difficult to impart with flame retardancy has been used, flame retardancy can easily be imparted.

Preferred use can be made of a halogenated flame retardant (G) which disperses without dissolving in the varnish. Preferred examples include the following, which have melting points of 300° C. or higher: ethylene dipentabromobenzene, ethylene bistetrabromophthalimide, ethylene bis(pentabromobiphenyl), decabromodiphenyloxide and tetradecabromodiphenoxybenzene. By using such halogenated flame retardants, it appears that halogen elimination at elevated temperatures can be suppressed and a decline in the heat resistance can be minimized.

From the standpoint of flame retardancy and heat resistance, the halogenated flame retardant (G) is preferably included in a proportion such as to make the halogen concentration in the combined amount of resin components (A) to (E) about 5 to 30 mass %.

In addition, the resin composition may also optionally include additives such as heat stabilizers, antistatic agents, ultraviolet absorbers, dyes and pigments, and lubricants within a range that does not detract from the advantageous effects of the invention.

The resin composition may be prepared into and used as a varnish (resin varnish) by mixing given amounts of the various above ingredients in a solvent. The solvent is not particularly limited, provided it is capable of dissolving the resin components, including the reaction product, the cyanate ester compound (D) and epoxy compound (E), and does not interfere with the curing reaction. Illustrative examples include organic solvents such as toluene, cyclohexanone, methyl ethyl ketone and propylene glycol monomethyl ether acetate.

In preparing this resin varnish, if necessary for such purposes as to promote dissolution or dispersion of the solid ingredients, the resin components may be heated within a temperature range that does not trigger the curing reactions. In addition, when optionally adding an inorganic filler (F) or a halogenated flame retardant (G), the varnish may be stirred using, for example, a ball mill, bead mill, planetary mixer or roll mill until a good dispersed state is achieved.

An example of a method for producing prepregs using the resulting varnish-like resin composition (resin varnish) is one in which the resin composition is impregnated into a fibrous base material, then dried.

Illustrative examples of the fibrous base material include glass cloth, aramid cloth, polyester cloth, glass nonwoven fabric, aramid nonwoven fabric, polyester nonwoven fabric, wood pulp-based paper and cotton linter paper. By using glass cloth, a laminate having an excellent mechanical strength is obtained; glass cloth that has been subjected to flattening treatment is especially preferred. Flattening treatment may be carried out by, for example, continuously applying a suitable pressure to the glass cloth with a roller press so as to flatten and compress the yarn. The fibrous base material used may be one having a thickness of, for example, from 0.02 to 0.3 mm.

Impregnation is carried out by dipping, coating or the like. If necessary, such impregnation may be repeated a plurality of times. When doing so, it is also possible to repeat impregnation using a plurality of solutions having different compositions or concentrations and thereby ultimately adjust the composition and amount of resin as desired.

The resin composition-impregnated fibrous base material is heated under the desired heating conditions, such as at from 80 to 170° C. for 1 to 10 minutes, thereby giving a prepreg in a semi-cured state (B-stage).

The method of producing a metal-clad laminate using the prepreg thus obtained may entail using a single prepreg or stacking together a plurality of such prepregs, then placing a metal foil such as copper foil, either on both the top and bottom sides or on only one side of the single prepreg or prepreg stack, and integrally laminating the resulting assembly by molding under applied heat and pressure so as to produce a laminate clad on one or both sides with metal foil. The heating and pressing conditions may be suitably set according to such factors as the thickness of the laminate to be produced and the type of prepreg resin composition. For example, the temperature may be set to from 170 to 220° C., the pressure may be set to from 3 to 4 MPa, and the time may be set to from 60 to 150 minutes.

The resin composition retains the outstanding dielectric properties of polyphenylene ether, in addition to which cured products obtained therefrom have an excellent heat resistance and also an excellent bond strength. As a result, metal-clad laminates obtained with prepregs formed using the resin composition, while retaining good dielectric properties and heat resistance, have improved adhesion (e.g., adhesive strength between metal foil and resin layers, adhesive strength between insulating layers) and are moreover of outstanding reliability.

A printed wiring board can be fabricated using the prepreg. Specifically, by etching or otherwise processing the metal foil at the surface of the laminate thus produced so as to form a circuit, it is possible to obtain a printed wiring board having a conductor pattern provided as a circuit on the surface of the laminate. The resulting printed wiring board has excellent dielectric properties, heat resistance and adhesion, thus enabling printed wiring boards of excellent reliability and heat resistance to be provided.

The major features of the art disclosed in this Description are summarized below.

The resin composition according to one aspect of the invention is characterized by including: a reaction product that includes (A) a polyphenylene ether having an average of 1.5 to 2 hydroxyl groups per molecule and (B) an epoxy compound having an average of 2 to 2.3 epoxy groups per molecule, wherein the reaction product is obtained by pre-reacting at least a part of hydroxyl groups on the polyphenylene ether (A) with epoxy groups on the epoxy compound (B) so that the concentration of terminal hydroxyl groups on the polyphenylene ether (A) becomes 700 µmol/g or less; (C) a cyanate ester compound; and (D) an organometallic salt.

Such a resin composition, while retaining the excellent dielectric properties of PPE, provides cured products obtained therefrom with outstanding heat resistance and adhesion.

In the resin composition of the invention, the molar ratio of epoxy groups on the epoxy compound (B) to hydroxyl groups on the polyphenylene ether (A) (epoxy groups/ hydroxyl groups) is more preferably from 3 to 6. This is thought to lower the viscosity of the pre-reacted product prior to reaction, in turn lowering the viscosity of the varnish and prepreg obtained therefrom and thus enhancing productivity.

Furthermore, in the inventive resin composition, it is preferable for the polyphenylene ether (A) to have a terminal hydroxyl group concentration of from 900 to 2,500 µmol/g. This has the effect of, due to pre-reaction with epoxy, controlling the terminal hydroxyl group concentration of the polyphenylene ether (A) to 700 µmol/g or less and thereby reliably increasing the adhesion.

Also, in the inventive resin composition, it is preferable for the polyphenylene ether (A) to have a number-average molecular weight of from 800 to 2,000. This results in a better moldability, enabling excellent dielectric properties and heat resistance to be more reliably obtained.

Moreover, in the resin composition of the invention, it is preferable for the polyphenylene ether (A) to be a compound of general formula (1) below:

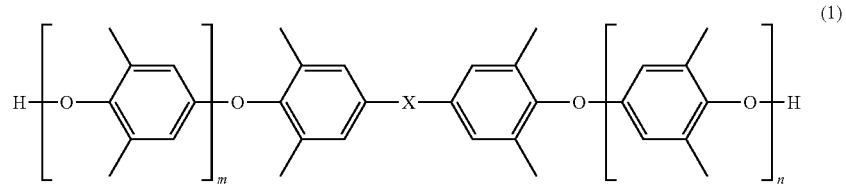

(wherein X is an alkylene group of 1 to 3 carbons or a direct bond, m is from 0 to 20, n is from 0 to 20, and the sum of m and n is from 1 to 30).

This enables excellent dielectric properties to be more reliably achieved.

The resin composition may further include an epoxy compound (E), in which case the resin composition preferably includes a dicyclopentadiene epoxy compound in a content of 50 mass % or more, based on the total epoxy compound in which the epoxy compound (B) and the epoxy compound (E) are combined. This is thought to enable the dielectric properties to be further enhanced.

Moreover, in the resin composition of the invention, letting the combined amount of the polyphenylene ether (A), the epoxy compound (B), the cyanate ester compound (C) and the epoxy compound (E) be 100 parts by mass, it is preferable for the content of the polyphenylene ether (A) to be from 20 to 40 parts by mass, for the combined content of the epoxy compound (B) and the epoxy compound (E) to be from 20 to 60 parts by mass, and for the content of the cyanate ester compound to be from 20 to 40 parts by mass. This has the effect of enabling a resin composition endowed with good dielectric properties, heat resistance and adhesion to be more reliably obtained.

The inventive resin composition may further include an inorganic filler (F), which has the advantage of enabling the dimensional stability during heating to be further enhanced.

In addition, by further including a halogenated flame retardant (G), a resin composition of even better flame retardancy can be obtained.

The resin varnish according to another aspect of the invention includes the resin composition according to the foregoing aspect of the invention, and a solvent. This makes it possible to obtain a resin varnish which is endowed with excellent dielectric properties and cured products of which have an excellent heat resistance and moreover a truly outstanding adhesion.

The prepreg according to yet another aspect of the invention is characterized by being obtained by impregnating the resin varnish in a fibrous base material. Such an arrangement can be suitably used to manufacture a metal-clad laminate of excellent dielectric properties, heat resistance and adhesion. Moreover, because the resin composition has a low viscosity and high flow properties, there can be obtained a prepreg of excellent reliability and heat resistance that can minimize the occurrence of molding defects during the manufacture of metal-clad substrates and printed wiring boards.

The metal-clad laminate according to a still further aspect of the invention is characterized by being obtained by laminating metal foil on the prepreg according to the foregoing aspect of the invention, and performing molding under applied heat and pressure. With this arrangement, there can be obtained metal-clad laminates of excellent reliability, from which laminates can be produced printed wiring boards of excellent dielectric properties, heat resistance and adhesion while minimizing the occurrence of molding defects.

The printed wiring board according to yet another aspect of the invention is characterized by being manufacturing using the above prepreg. With this arrangement, there can be obtained a printed wiring board which, owing to excellent dielectric properties, heat resistance and adhesion, also has an excellent reliability and heat resistance even in high multilayer constructions.

The invention is illustrated more fully below by way of examples, although these examples do not limit the scope of the invention.

EXAMPLES

Preparation of Reaction Product

The ingredients used in preparing the reaction products in these examples are described below.

(Polyphenylene Ether (A))

PPE 1: SA 90, available from SABIC's Innovative Plastics (number-average molecular weight, 1,500; number of hydroxyl groups, 1.9; terminal hydroxyl group concentration, 1,270 µmol/g; X in structural formula (1), —C(CH$_3$)$_2$—)

PPE 2: SA 120, available from SABIC's Innovative Plastics (number-average molecular weight, 2,500; number of hydroxyl groups, 1; terminal hydroxyl group concentration, 400 µmol/g)

PPE 3: Polyphenylene ether (a polyphenylene ether prepared by the method described in WO 2007/067669; number-average molecular weight, 800; number of hydroxyl groups, 1.8; terminal hydroxyl group concentration, 2,250 µmol/g)

(Epoxy Compound (B))

Epoxy resin 1: A dicyclopentadiene epoxy compound having an average number of 2.3 functional groups per molecule, available as Epiclon HP 7200 (DIC Corporation)

Epoxy resin 2: A dicyclopentadiene epoxy compound having an average number of 3 functional groups per molecule, available as Epiclon HP 7200H (DIC Corporation)

Epoxy resin 3: A bisphenol A epoxy compound having an average number of 2 functional groups per molecule, available as Epiclon 850S (DIC Corporation)

Epoxy resin 4: An alkyl phenol glycidyl ether having an average number of 1 functional group per molecule, available as Epiclon 520 (DIC Corporation)

(Catalyst Used During Pre-Reaction)

2E4MZ: 2-Ethyl-4-methyl-imidazole (available from Shikoku Chemicals Corporation)

[Method of Preparation]

The ingredients were added to toluene in the compounding ratios indicated in Tables 1 and 2, then stirred at 100° C. for a period of from 2 to 10 hours. The reaction product was prepared by pre-reacting the polyphenylene ether and the epoxy resin in this way. Preparation was carried out in such a way that the solids concentration of the resulting reaction product became 60% in each case.

[Results of Pre-Reaction (Reaction)]

The pre-reaction was evaluated by visually examining the reaction product to determine whether gelation had occurred. If no gelation occurred, the results were rated as "OK".

Next, the terminal hydroxyl group concentration of the polyphenylene ether following pre-reaction was measured as follows.

Specifically, the solution of (A) and (B) mixed together prior to the pre-reaction and the solution following the pre-reaction each had added thereto, in methylene chloride, an ethanol solution of 10% tetraethylammonium hydroxide and, using an ultraviolet spectrophotometer (UV mini-1240, from Shimadzu Corporation), were respectively measured at a measurement wavelength of 318 nm. The terminal hydroxyl group concentration was calculated from the absorbances obtained and the content of (A).

The above results are shown in Tables 1 and 2.

[Preparation of Resin Composition]

The ingredients used when preparing the resin compositions in the examples of the invention are described below.

(Cyanate Ester Compound (C))
- 2,2-Bis(4-cyanatophenyl)propane (available as "BADCy" from LONZA Japan)

(Organometallic Salt (D))
- Copper naphthenate (available as "Cu-NAPHTHENATE" from DIC Corporation)
- Zinc octanoate (available as "Zn-OCTOATE" from DIC Corporation)

(Additional Epoxy Compound (E))
- Epoxy resin 2: A dicyclopentadiene epoxy compound having an average number of 3 functional groups per molecule, available as Epiclon HP 7200H (DIC Corporation)

(Other Ingredients)
- Curing agent: 2-Ethyl-4-methyl-imidazole, available as "2E4MZ" (Shikoku Chemicals Corporation)
- Inorganic filler (F): Spherical silica particles (available as "SC2500-SEJ" from Admatechs)
- Halogenated flame retardant (G): A brominated flame retardant (ethylenebis(pentabromobiphenyl), available as "SAYTEX 8010" from Albemarle Japan Corporation; and

[Method of Preparation]

The resulting reaction product solution was heated to 60° and the cyanate compound and the organometallic salt (in Example 7, the epoxy compound as well) were added thereto in the proportions shown in Tables 1 and 2, after which complete dissolution was effected by 30 minutes of stirring. In addition, other ingredients such as a halogenated flame retardant and silica particles were added and dispersion was carried out with a bead mill, giving a resin composition in the form of a varnish (resin varnish).

Next, the resulting resin varnish was impregnated into glass cloth (#2116 type, WEA116E, E glass; manufactured by Nitto Boseki Co., Ltd.), then dried under heating at 130 to 160° C. for about 3 to 8 minutes, giving a prepreg. The content of the resin components (resin content), including the polyphenylene ether, epoxy resin and curing agent, was adjusted at this time so as to be about 55 mass %.

In each example, six sheets of the resulting prepreg were stacked together and the stack was laminated between sheets of copper foil (GT-MP, available from Furukawa Circuit Foil Co., Ltd.; thickness, 35 μm), following which the resulting assembly was subjected to applied heat and pressure at a temperature of 200° C. and a pressure of 3 MPa for 2 hours, giving a test substrate having a thickness of 0.8 mm.

TABLE 1

| | | Content | Product name | Ex. 1 | Ex. 2 | Ex. 3 | Ex. 4 | Ex. 5 | Ex. 6 | Ex. 7 | Ex. 8 | Ex. 9 | Ex. 10 | Ex. 11 | Ex. 12 | Ex. 13 | Ex. 14 |
|---|---|---|---|---|---|---|---|---|---|---|---|---|---|---|---|---|---|
| Pre-reaction | | PPE 1 | SA 90 | 30 | 30 | 30 | 30 | 24 | 35 | 30 | 30 | 30 | 30 | | 20 | 30 | 38 |
| | | PPE 2 | SA 120 | | | | | | | | | | | 25 | | | |
| | | PPE 3 | Produced in house | | | | | | | | | | | | | | |
| | | Epoxy resin 1 | HP 7200 | 40 | 40 | 40 | 40 | 46 | 35 | 30 | 40 | 40 | 20 | 45 | 50 | | |
| | | Epoxy resin 2 | HP 7200H | | | | | | | | | | | | | | 32 |
| | | Epoxy resin 3 | 850S | | | | | | | | | | | | | 40 | |
| | | Epoxy resin 4 | Epiclon 520 | | | | | | | | | | 20 | | | | |
| | | Imidazole | 2E4MZ | 0.07 | 0.07 | 0.07 | 0.07 | 0.07 | 0.07 | 0.06 | 0.07 | 0.07 | 0.04 | 0.07 | 0.07 | 0.07 | 0.07 |
| | | Epoxy/hydroxyl group molar ratio at time of pre-reaction | | 4.1 | 4.1 | 4.1 | 4.1 | 5.9 | 3.1 | 3.1 | 4.1 | 4.1 | 4.8 | 3.1 | 7.7 | 5.5 | 2.6 |
| | | Results of pre-reaction | | OK | OK | OK | OK | OK | OK | OK | OK | OK | OK | OK | OK | OK | OK |
| | | Hydroxyl group concentration after pre-reaction (μmol/g) | | 10 | 100 | 400 | 700 | 10 | 10 | 10 | 10 | 10 | 10 | 10 | 100 | 10 | 10 |
| | | Epoxy resin 2 | HP 7200H | 30 | 30 | 30 | 30 | 30 | 30 | 10 | 30 | 30 | 30 | 30 | 30 | 30 | 30 |
| | | Cyanate ester | BADCy | | | | | | | 30 | | | | | | | |
| | | Organometallic salt 1 | Cu-NAPHTHENATE | 0.05 | 0.05 | 0.05 | 0.05 | 0.05 | 0.05 | 0.05 | 0.05 | | 0.05 | 0.05 | 0.05 | 0.05 | 0.05 |
| | | Organometallic salt 2 | Zn-OCTOATE | | | | | | | | | 0.005 | | | | | |
| | | Imidazole | 2E4MZ | | | | | | | | | | | | | | |
| | | Inorganic filler (silica) | SC2500-SEJ | | | | | | | | 70 | | | | | | |
| | | Halogenated flame retardant | SAYTEX 8010 | | | | | | | | 30 | | | | | | |
| Evaluation results | | Prepreg melt viscosity (poise) | | 1,800 | 1,500 | 1,300 | 1,000 | 1,000 | 3,500 | 3,000 | 2,300 | 1,800 | 1,200 | 2,000 | 800 | 1,000 | 5,000 |
| | | Tg (°C) | | 215 | 215 | 215 | 215 | 215 | 215 | 220 | 215 | 215 | 215 | 215 | 215 | 200 | 215 |
| | | Dielectric constant | | 3.9 | 3.9 | 3.9 | 3.9 | 4.0 | 3.8 | 3.9 | 3.9 | 3.9 | 3.9 | 4.0 | 4.1 | 4.0 | 3.9 |
| | | Loss tangent | | 0.007 | 0.007 | 0.007 | 0.007 | 0.007 | 0.007 | 0.007 | 0.007 | 0.007 | 0.007 | 0.007 | 0.008 | 0.007 | 0.007 |
| | | Oven heat resistance (270° C.) | | OK | OK | OK | OK | OK | OK | OK | OK | OK | OK | OK | OK | OK | OK |
| | | Copper foil bond strength (kgf/cm) | | 1.6 | 1.5 | 1.4 | 1.3 | 1.6 | 1.6 | 1.6 | 1.5 | 1.6 | 1.6 | 1.6 | 1.4 | 1.6 | 1.6 |
| | | Bond strength between layers (kgf/cm) | | 1.2 | 1.1 | 1.0 | 0.9 | 1.2 | 1.2 | 1.2 | 1.1 | 1.2 | 1.2 | 1.2 | 1.0 | 1.2 | 1.2 |

TABLE 2

| | Content | Product name | Comp. Ex. 1 | Comp. Ex. 2 | Comp. Ex. 3 | Comp. Ex. 4 | Comp. Ex. 5 |
|---|---|---|---|---|---|---|---|
| Pre-reaction | PPE 1 | SA 90 | 30 | | 30 | 30 | 30 |
| | PPE 2 | SA 120 | | 30 | | | |
| | PPE 3 | Produced in-house | | | | | |
| | Epoxy resin 1 | HP 7200 | 40 | 40 | | | 40 |
| | Epoxy resin 2 | HP 7200H | | | 40 | | |
| | Epoxy resin 3 | 850S | | | | | |
| | Epoxy resin 4 | Epiclon 520 | | | | 40 | |
| | Imidazole | 2E4MZ | 0.07 | 0.20 | 0.07 | 0.07 | 0.07 |
| | Epoxy/hydroxyl group molar ratio at time of pre-reaction | | 4.1 | 13.0 | 3.8 | 5.0 | 4.1 |
| | Results of pre-reaction | | OK | OK | gelation | OK | OK |
| | Hydroxyl group concentration after pre-reaction (μmol/g) | | 800 | 300 | — | 100 | 10 |
| | Epoxy resin 2 | HP 7200H | | | — | | |
| | Cyanate ester | BADCy | 30 | 30 | — | 30 | 30 |
| | Organometallic salt 1 | Cu-NAPHTHENATE | 0.05 | 0.05 | — | 0.05 | |
| | Organometallic salt 2 | Zn-OCTOATE | | | — | | |
| | Imidazole | 2E4MZ | | | — | | 1.5 |
| | Inorganic filler (silica) | SC2500-SEJ | | | — | | |
| | Halogenated flame retardant | SAYTEX 8010 | | | — | | |
| Evaluation results | Prepreg melt viscosity (poise) | | 800 | 6,000 | — | 1,000 | 1,800 |
| | Tg (° C.) | | 215 | 220 | — | 195 | 190 |
| | Dielectric constant | | 3.9 | 3.9 | — | 3.9 | 4.0 |
| | Loss tangent | | 0.007 | 0.007 | — | 0.007 | 0.008 |
| | Oven heat resistance (270° C.) | | OK | NG | — | NG | NG |
| | Copper foil bond strength (kgf/cm) | | 1.2 | 1.1 | — | 1.4 | 1.4 |
| | Bond strength between layers (kgf/cm) | | 0.8 | 0.6 | — | 0.9 | 0.8 |

The prepregs and test substrates produced as described above were evaluated by the methods shown below.

[Melt Viscosity of Prepreg (Poise)]

The melt viscosity at 130° C. of the prepreg was measured using a CFT-500A flow tester from Shimadzu Corporation.

[Glass Transition Temperature (Tg)]

The Tg of each prepreg was measured using a DMS 100 dynamic mechanical spectrometer from Seiko Instruments. At this time, the frequency in the bending module was set to 10 Hz and dynamic mechanical analysis (DMA) was carried out. The temperature at which tan α reached a maximum when the temperature was raised at a rate of 5° C./min from room temperature to 280° C. was treated as Tg.

[Dielectric Properties (Dielectric Constant and Loss Tangent)]

The dielectric constants and loss tangents of the copper-clad laminates at 2 GHz were measured using a CP461 cavity resonator from Kanto Electronics Application & Development, Inc.

[Oven Heat Resistance]

In accordance with JIS C 6481, a copper-clad laminate cut to a predetermined size was left to stand for one hour in a thermostatic chamber set to 270° C., following which it was removed from the chamber. The treated specimen was visually examined and was rated as "OK" if no swelling had occurred, and was rated as "NG" if swelling had occurred.

[Copper Foil Bond Strength (Copper Foil Peel Strength)]

The peel strength of the copper foil (copper foil bond strength) from the surface of the resulting copper-clad laminate was measured in accordance with JIS C 6481. At this time, a pattern having a width of 10 mm and a length of 100 mm was formed on a specimen having a width of 20 mm and a length of 100 mm, the copper foil was peeled off at a rate of 50 mm/min by a peel tester, and the peel strength (kgf/cm) at this time was measured as the copper foil bond strength.

[Adhesion between Layers]

The bond strength between layers was measured in accordance with JIS C 6481.

The above results are shown in Tables 1 and 2.

As is apparent from Tables 1 and 2, cases in which resin compositions according to the present embodiment were used (Examples 1 to 14), compared with Comparative Examples 1 to 5 in which resin compositions outside the range of this embodiment were used, were confirmed to exhibit a high Tg and truly outstanding adhesion while at the same time retaining the excellent dielectric properties of PPE.

In Comparative Example 1 where the PPE terminal hydroxyl group concentration following pre-reaction exceeds 700 μmol/g, and in Comparative Example 2 where PPE having an average number of hydroxyl groups per molecule of less than 1.5 was used, high adhesions comparable to those in the examples of the invention were not exhibited. Also, in Comparative Example 3 in which an epoxy compound having an average number of functional groups higher than 2.3 was used, gelation occurred as a result of the pre-reaction. In Comparative Example 4 in which an epoxy compound having an average number of functional groups of less than 2 was used in the pre-reaction, and in Comparative Example 5 in which an organometallic salt was not used, the Tg or the heat resistance was lowered and the adhesion decreased.

This application is based on Japanese Patent Application No. 2013-24219 filed on Feb. 12, 2013, the entire contents of which are incorporated herein by reference.

Although the invention has been fully and appropriately described above by way of specific embodiments, it should be appreciated that various modifications and/or improvements thereto will be readily apparent to those skilled in the art. It is therefore to be understood that such modified or improved embodiments practiced by those skilled in the art, insofar as they do not depart from the scope of the claims as set forth herein, are encompassed within the scope of the claims.

INDUSTRIAL APPLICABILITY

This invention has wide industrial applicability in technical fields relating to resin compositions, resin varnishes, prepregs, metal-clad laminates and printed wiring boards.

The invention claimed is:

1. A resin composition comprising:
   a reaction product that includes (A) a polyphenylene ether having an average of 1.5 to 2 hydroxyl groups per molecule and (B) an epoxy compound having an average of 2 to 2.3 epoxy groups per molecule, wherein the reaction product is obtained by pre-reacting at least a part of hydroxyl groups on the polyphenylene ether (A) with epoxy groups on the epoxy compound (B) so that the concentration of terminal hydroxyl groups on the polyphenylene ether (A) becomes 700 μmol/g or less;
   (C) a cyanate ester compound; and
   (D) an organometallic salt.

2. The resin composition according to claim 1, wherein the molar ratio of epoxy groups on the epoxy compound (B) to hydroxyl groups on the polyphenylene ether (A) is from 3 to 6.

3. The resin composition according to claim 1, wherein the pre-reacting at least a part of hydroxyl groups on the polyphenylene ether (A) includes pre-reaction with a polyphenylene ether (A) having a terminal hydroxyl group concentration of from 900 to 2,500 μmol/g.

4. The resin composition according to claim 1 wherein the polyphenylene ether (A) has a number-average molecular weight of from 800 to 2,000.

5. The resin composition according to claim 1, wherein the polyphenylene ether (A) is a compound of general formula (1) below:

6. The resin composition according to claim 1, wherein the epoxy compound (B) includes 50 mass % or more of a dicyclopentadiene epoxy compound.

7. The resin composition according to claim 1, wherein the content of the polyphenylene ether (A) is from 20 to 40 parts by mass, the content of the epoxy compound (B) is from 20 to 60 parts by mass, and the content of the cyanate ester compound (C) is from 20 to 40 parts by mass, when the combined amount of the polyphenylene ether (A), the epoxy compound (B) and the cyanate ester compound (C) is 100 parts by mass.

8. The resin composition according to claim 1, further comprising (E) an epoxy compound.

9. The resin composition according to claim 8, comprising a dicyclopentadiene epoxy compound in a content of 50 mass % or more, based on the total epoxy compound in which the epoxy compound (B) and the epoxy compound (E) are combined.

10. The resin composition according to claim 8, wherein the content of the polyphenylene ether (A) is from 20 to 40 parts by mass, the combined content of the epoxy compound (B) and the epoxy compound (E) is from 20 to 60 parts by mass, and the content of the cyanate ester compound (C) is from 20 to 40 parts by mass, when the combined amount of the polyphenylene ether (A), the epoxy compound (B), the cyanate ester compound (C) and the epoxy compound (E) is 100 parts by mass.

11. The resin composition according to claim 1, further comprising (F) an inorganic filler.

12. The resin composition according to claim 1, further comprising (G) a halogenated flame retardant.

13. A resin varnish comprising: the resin composition according to claim 1; and a solvent.

14. A prepreg obtained by impregnating the resin varnish according to claim 13 into a fibrous base material.

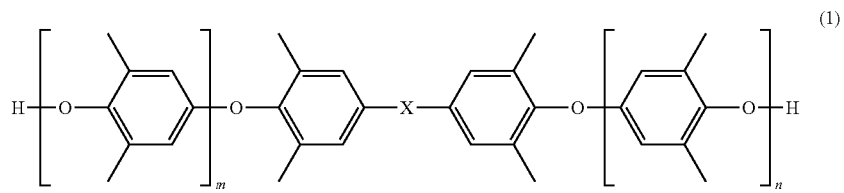

(1)

wherein X is an alkylene group of 1 to 3 carbons or a direct bond, m is from 0 to 20, n is from 0 to 20, and the sum of m and n is from 1 to 30.

15. A metal-clad laminate obtained by laminating metal foil on the prepreg according to claim 14, and performing molding under applied heat and pressure.

16. A printed wiring board obtained by partially removing the metal foil from the surface of the metal-clad laminate according to claim 15 to form a circuit.

\* \* \* \* \*